United States Patent
Hsu et al.

(10) Patent No.: US 11,732,160 B2
(45) Date of Patent: Aug. 22, 2023

(54) COMPOSITE FILM FOR USE IN LED WAFER-LEVEL PACKAGING PROCESS

(71) Applicant: TAIMIDE TECHNOLOGY INCORPORATION, Hsinchu Hsien (TW)

(72) Inventors: Chun-Chi Hsu, Hsinchu Hsien (TW); Chun-Ting Lai, Hsinchu Hsien (TW); Chih-Wei Lin, Hsinchu Hsien (TW)

(73) Assignee: TAIMIDE TECHNOLOGY INCORPORATION, Hsinchu Hsien (TW)

( * ) Notice: Subject to any disclaimer, the term of this patent is extended or adjusted under 35 U.S.C. 154(b) by 257 days.

(21) Appl. No.: 17/106,211

(22) Filed: Nov. 30, 2020

(65) Prior Publication Data
US 2021/0198528 A1   Jul. 1, 2021

(30) Foreign Application Priority Data
Dec. 25, 2019 (TW) .................. 108147584

(51) Int. Cl.
*C09J 7/38* (2018.01)
*C09J 7/25* (2018.01)
*H01L 33/00* (2010.01)

(52) U.S. Cl.
CPC . *C09J 7/38* (2018.01); *C09J 7/25* (2018.01); *C09J 7/383* (2018.01); *C09J 7/385* (2018.01); *H01L 33/0095* (2013.01); *C09J 2203/326* (2013.01); *C09J 2301/1242* (2020.08); *C09J 2301/312* (2020.08); *C09J 2433/00* (2013.01); *C09J 2479/086* (2013.01)

(58) Field of Classification Search
None
See application file for complete search history.

(56) References Cited

U.S. PATENT DOCUMENTS

2022/0315743 A1* 10/2022 Meul ................. B29C 48/40

FOREIGN PATENT DOCUMENTS

WO   WO-2019188543 A1 * 10/2019 ............. B32B 37/06

OTHER PUBLICATIONS

Machine translation of WO 2019/188543 A1 (Year: 2019).*

* cited by examiner

*Primary Examiner* — Frank D Ducheneaux

(57) ABSTRACT

A composite film for use in an LED wafer-level packaging process to facilitate adhesion of an LED wafer to a carrier and an LED wafer-level packaging process carried out with a heating process are introduced. The composite film includes a substrate including a first surface and a second surface; a heat-resisting pressure-sensing adhesive formed on the first surface of the substrate to allow the LED wafer to be adhered to the substrate; and a heat-resisting thermally-visbreaking pressure-sensing adhesive formed on the second surface of the substrate to allow the substrate to be adhered to the carrier. The heat-resisting thermally-visbreaking pressure-sensing adhesive undergoes the heating process to reduce its adhesiveness strength; thus, upon completion of the LED wafer-level packaging process, the carrier can be detached from the composite film easily.

3 Claims, 4 Drawing Sheets

COMPOSITE FILM FOR USE IN LED WAFER-LEVEL PACKAGING PROCESS

CROSS-REFERENCE TO RELATED APPLICATION

This non-provisional application claims priority under 35 U.S.C. § 119(a) on Patent Application No(s). 108147584 filed in Taiwan, R.O.C. on Dec. 25, 2019, the entire contents of which are hereby incorporated by reference.

BACKGROUND OF THE INVENTION

1. Field of the Invention

The present disclosure relates to a composite film for use in an LED wafer-level packaging process and, more particularly, to a composite film adapted for use in an LED wafer-level packaging process, adhered to a carrier, and subjected to a heating process so as to complete the LED wafer-level packaging process, allowing the carrier to be removed from the composite film easily without leaving behind residues.

2. Description of the Related Art

Referring to FIG. 1, a composite film for use in a conventional LED wafer-level packaging process comprises a substrate 10, a heat-resisting pressure-sensing adhesive 12 adhered to a surface of the substrate 10, and a photocuring pressure-sensing adhesive 14 (commonly known as UV adhesive) adhered to the other surface of the substrate 10. Referring to FIG. 2, which is a schematic view of the conventional LED wafer-level packaging process, the photocuring pressure-sensing adhesive 14 (commonly known as UV adhesive) of the substrate 10 is adhered to a glass carrier 16, and then an LED wafer is adhered to the heat-resisting pressure-sensing adhesive 12. After that, the LED wafer is cut into single die 18 to be processed and packaged at high temperature to form a package 22 which is then cut into single die package. Next, an adhesive tape 24 is adhered to the package 22, and the glass carrier 16 is irradiated with UV before being removed. At last, the adhesive tape 24 is removed to complete the LED wafer-level packaging process.

The photocuring pressure-sensing adhesive 14 (commonly known as UV adhesive) of the conventional composite film demonstrates insufficient heat resistance capability during the high-temperature process; as a result, upon the removal of the glass carrier 16, residues are adhered to the glass carrier 16, leading to difficulty in separation. Furthermore, the removal of the glass carrier 16 requires the purchase of radiation equipment and the introduction of new workstations, leading to increased production cost and decreased production efficiency. Moreover, owing to the chemical formula design for its UV adhesive system, the heat resistance capability of the photocuring pressure-sensing adhesive 14 is so insufficient that its subsequent separation from the glass carrier 16 is likely to end up with residues. In addition, a photocuring pressure-sensing adhesive patch is difficult to preserve, because its adhesiveness is undermined by the inevitable presence of UV in conventional storage or working environments. Therefore, the conventional composite film for use in an LED wafer-level packaging process still has room for improvement.

BRIEF SUMMARY OF THE INVENTION

The present disclosure provides a composite film for use in an LED wafer-level packaging process to facilitate adhesion of an LED wafer to a carrier and an LED wafer-level packaging process carried out with a heating process. The composite film comprises: a substrate comprising a first surface and a second surface; a heat-resisting pressure-sensing adhesive formed on the first surface of the substrate and adapted to allow the LED wafer to be adhered to the substrate; and a heat-resisting thermally-visbreaking pressure-sensing adhesive formed on the second surface of the substrate and adapted to allow the substrate to be adhered to the carrier, wherein the heat-resisting thermally-visbreaking pressure-sensing adhesive has an adhesiveness strength greater than 200 gf/inch before heating and an adhesiveness strength less than 150 gf/inch after heating, thereby allowing the carrier to be detached from the composite film easily upon completion of the LED wafer-level packaging process.

DETAILED DESCRIPTION OF THE INVENTION

To facilitate understanding of the object, characteristics and effects of this present disclosure, embodiments together with the attached drawings for the detailed description of the present disclosure are provided.

Figure 1:
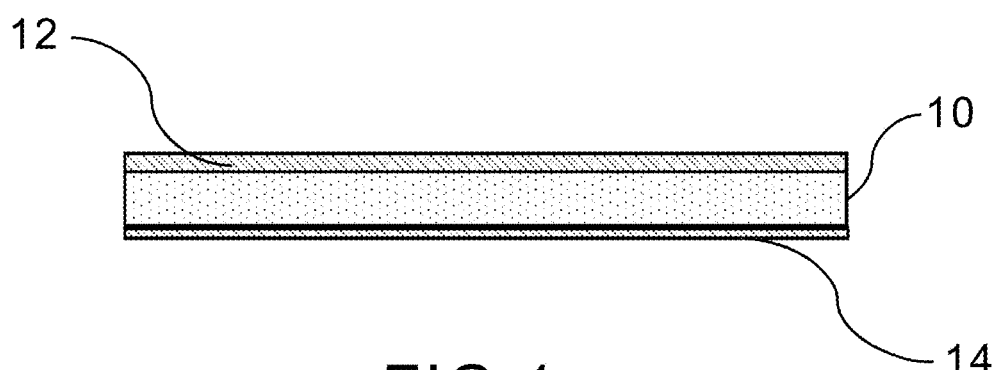
FIG. 1 (PRIOR ART) is a schematic view of a conventional composite film for use in an LED wafer-level packaging process.
Figure 2:
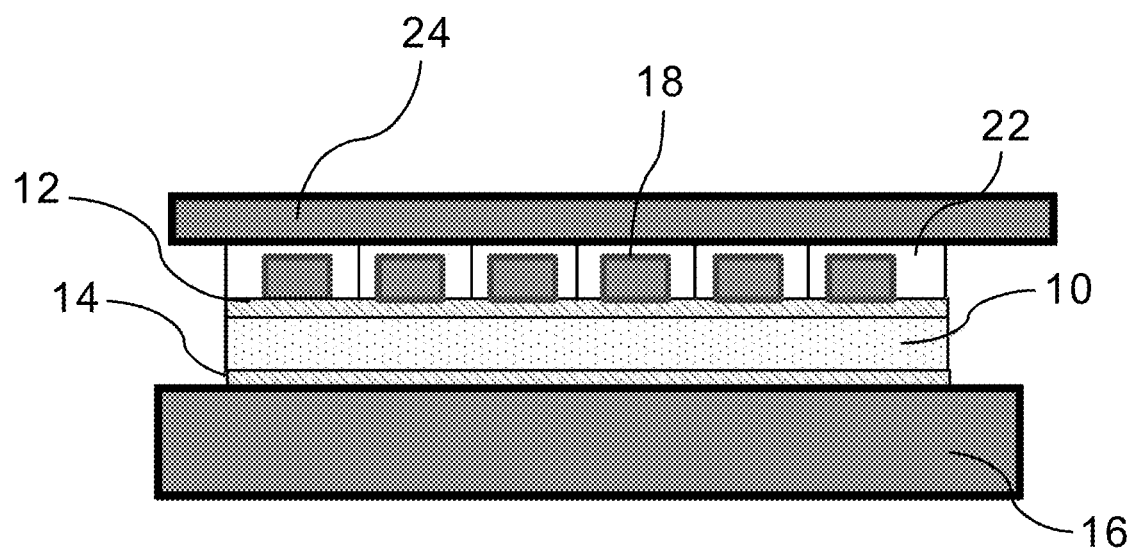
FIG. 2 (PRIOR ART) is a schematic view of a conventional LED wafer-level packaging process.
Figure 3:
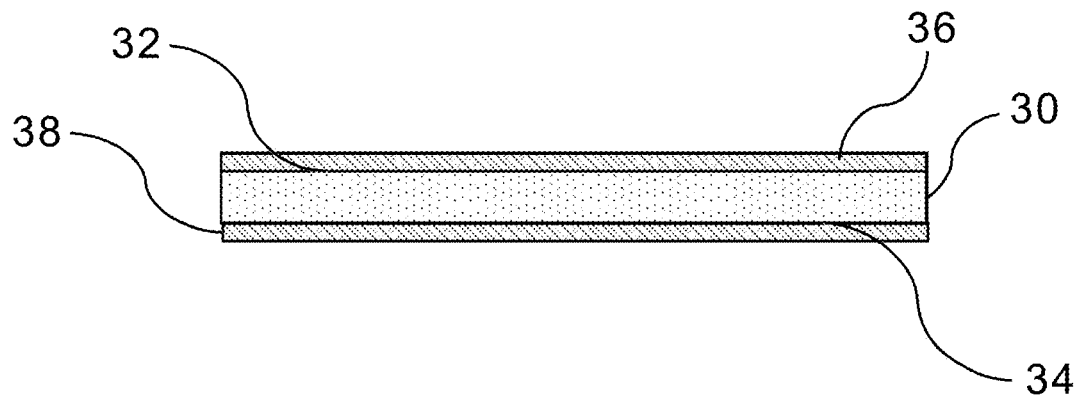
FIG. 3 is a schematic view of a composite film for use in an LED wafer-level packaging process according to the present disclosure.
Figure 4:
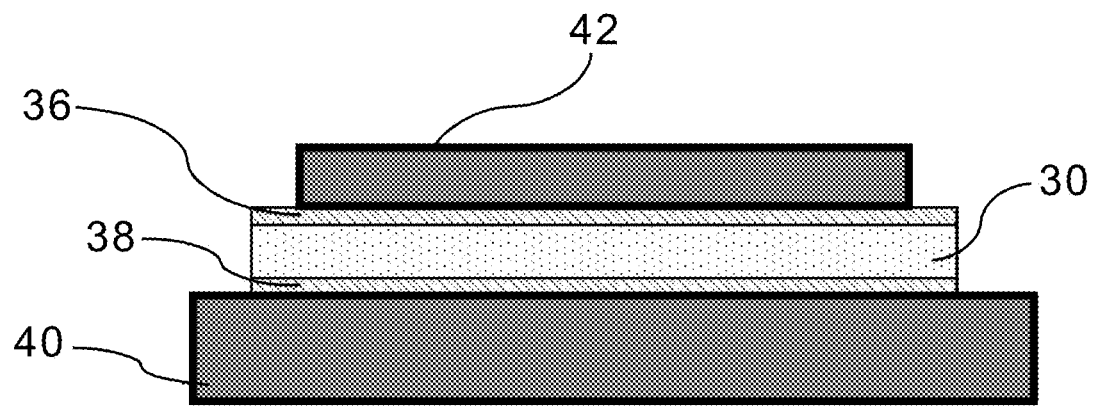
FIG. 4 is the first schematic view of the composite film for use in an LED wafer-level packaging process according to the present disclosure.
Figure 5:
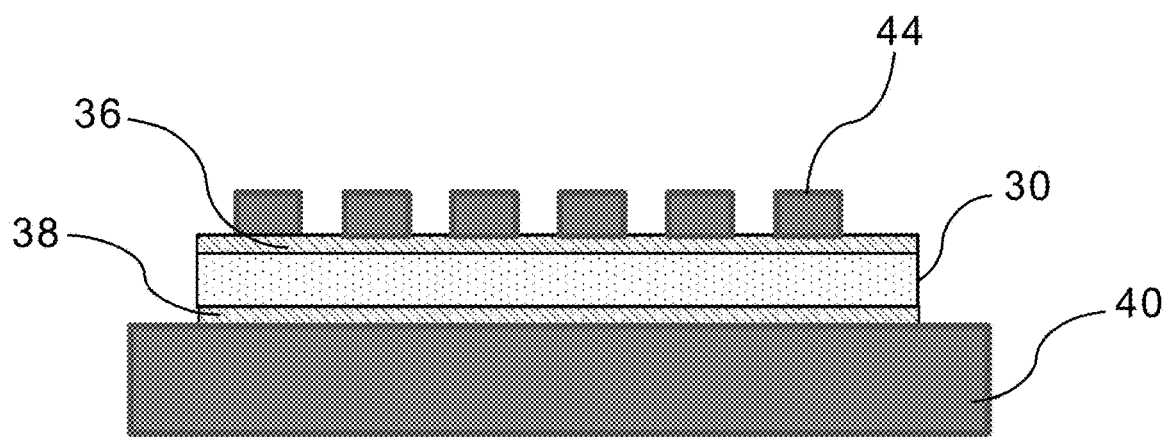
FIG. 5 is the second schematic view of the composite film for use in an LED wafer-level packaging process according to the present disclosure.
Figure 6:
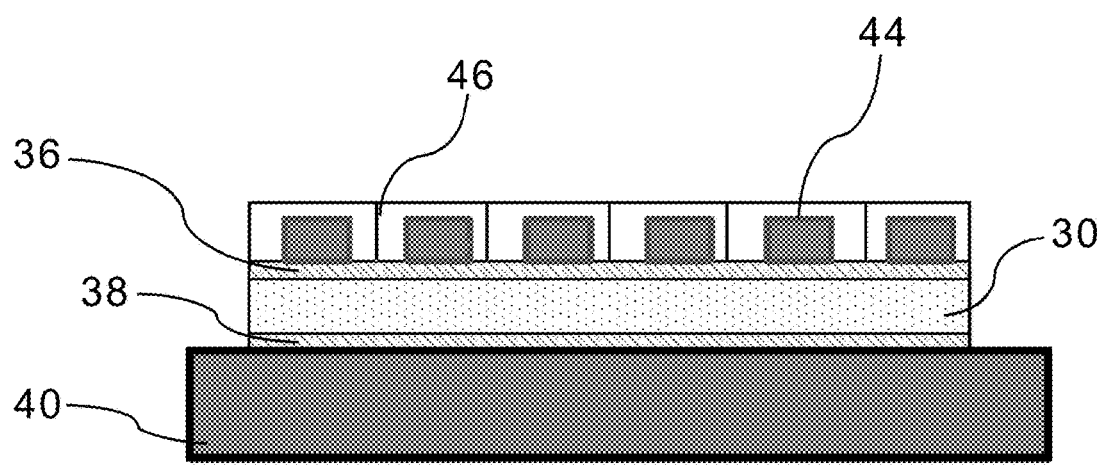
FIG. 6 is the third schematic view of the composite film for use in an LED wafer-level packaging process according to the present disclosure.
Figure 7:
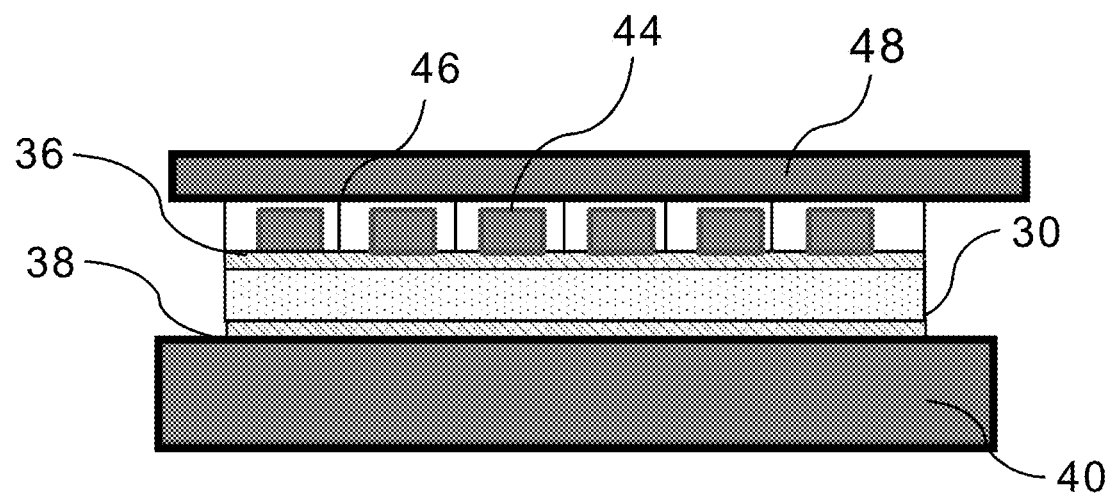
FIG. 7 is the fourth schematic view of the composite film for use in an LED wafer-level packaging process according to the present disclosure.
Figure 8:
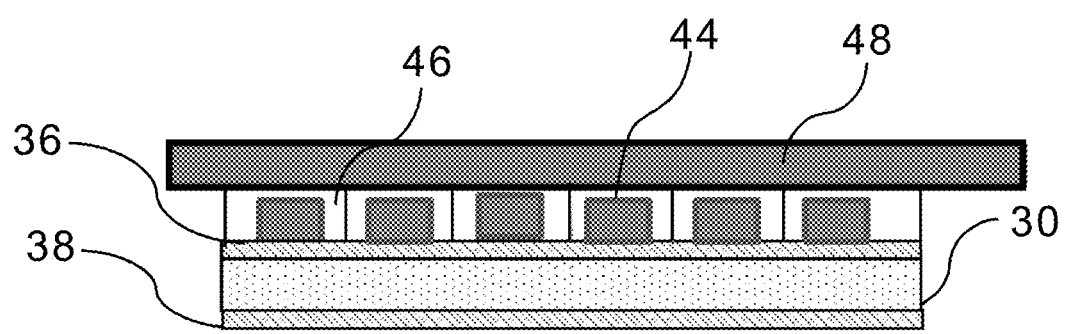
FIG. 8 is the fifth schematic view of the composite film for use in an LED wafer-level packaging process according to the present disclosure.

Referring to FIG. 3, the present disclosure provides a composite film for use in an LED wafer-level packaging process. The composite film comprises a polyimide film substrate 30, a heat-resisting pressure-sensing adhesive 36, and a heat-resisting thermally-visbreaking pressure-sensing adhesive 38. The polyimide film substrate 30 comprises a first surface 32 and a second surface 34. The heat-resisting pressure-sensing adhesive 36, which is formed on the first surface 32 of the substrate 30, is one selected from pressure-sensing adhesive systems with conventional heat-resisting formulas, such as rubber pressure-sensing adhesive agent, allyl pressure-sensing adhesive patch, vinyl-alkyl ether pressure-sensing adhesive patch, silicone pressure-sensing adhesive patch, polyester pressure-sensing adhesive patch, polyamide pressure-sensing adhesive patch, ethyl carbamate pressure-sensing adhesive patch, polystyrene/diene copolymer pressure-sensing adhesive patch, allyl pressure-sensing adhesive agent, ethyl carbamate pressure-sensing adhesive agent, and polystyrene/diene copolymer. The heat-resisting thermally-visbreaking pressure-sensing adhesive 38 is formed on the second surface 34 of the substrate 30. The heat-resisting thermally-visbreaking pressure-sensing adhesive 38 has an adhesiveness strength greater than 200 gf/inch before heating and an adhesiveness strength less than 150 gf/inch after heating.

Referring to FIG. 4 through FIG. 7, there are shown schematic views of the composite film for use in an LED wafer-level packaging process according to the present disclosure. The heat-resisting thermally-visbreaking pressure-sensing adhesive 38 of the substrate 30 is adhered to a carrier 40. An LED wafer 42 is adhered to the heat-resisting pressure-sensing adhesive 36 of the substrate 30, then cut into a single die 44, and finally subjected to a die packaging process. After that, the packaged single die 44 is cut into a single die package 46. Next, an adhesive tape 48 is adhered to the single die package 46, and then the carrier 40 is removed.

DESCRIPTION OF EMBODIMENTS AND COMPARISONS

Embodiment 1

A heat-resisting acrylic adhesive agent, such as 50 g of HT-6555-1 (purchased from Total Acrylic Polymer Industry (TAPI) Corporation), and 1.5 g of cross-linking agent N (purchased from Total Acrylic Polymer Industry (TAPI) Corporation) are introduced into a 250 ml container and stirred for 10 minutes. The mixture is coated on a polyimide substrate (model number: TL-025, purchased from Taimide Technology Incorporation) with a scraper capable of gap control to thereby ensure that the coating adhesive is 10 µm thick. Then, the polyimide substrate is placed in an oven to undergo solvent removal by being baked at 100° C. for 30 minutes. After that, a sample is taken out of the oven, and the sample is covered with a release film. Next, the sample undergoes a ripening process at 50° C. for 24 hours to form the heat-resisting pressure-sensing adhesive layer on the first surface of the composite film. A heat-resisting acrylic adhesive agent, such as 50 g of HT-6555-1 (purchased from Total Acrylic Polymer Industry (TAPI) Corporation), 0.5 g of cross-linking agent N (purchased from Total Acrylic Polymer Industry (TAPI) Corporation), 3 g of U-4HA (purchased from Shin-Nakamura Chemical Co., Ltd.), 5 g of U-4H (purchased from Shin-Nakamura Chemical Co., Ltd.), and 0.5 g of 1,1,3,3-tetramethylbutyl hydroperoxide (purchased from ECHO Chemical Co., Ltd.) are introduced into a 250 ml container and stirred for 10 minutes. The mixture is coated on the other side of the polyimide substrate already coated with the heat-resisting adhesive with a scraper capable of gap control to thereby ensure that the coating adhesive is 40 µm thick. Then, the polyimide substrate is placed in an oven to undergo solvent removal by being baked at 100° C. for 30 minutes. After that, a sample is taken out of the oven, and the sample is covered with a release film, thereby forming the heat-resisting thermally-visbreaking pressure-sensing adhesive layer on the second surface of the composite film. An adhesiveness strength testing method intended for result evaluation shows that the first surface has an adhesiveness strength of 267 gf/inch before the heating process and an adhesiveness strength of 412 gf/inch after the heating process, and shows that the second surface has an adhesiveness strength of 1082 gf/inch before the heating process and an adhesiveness strength of 132 gf/inch after the heating process.

Embodiment 2

A heat-resisting acrylic adhesive agent, such as 50 g of HT-6555-1 (purchased from Total Acrylic Polymer Industry (TAPI) Corporation), and 1.5 g of cross-linking agent N (purchased from Total Acrylic Polymer Industry (TAPI) Corporation) are introduced into a 250 ml container and stirred for 10 minutes. The mixture is coated on a polyimide substrate (model number: TL-025, purchased from Taimide Technology Incorporation) with a scraper capable of gap control to thereby ensure that the coating adhesive is 10 µm thick. Then, the polyimide substrate is placed in an oven to undergo solvent removal by being baked at 100° C. for 30 minutes. After that, a sample is taken out of the oven, and the sample is covered with a release film. Next, the sample undergoes a ripening process at 50° C. for 24 hours to form the heat-resisting pressure-sensing adhesive layer on the first surface of the composite film. A heat-resisting acrylic adhesive agent, such as 50 g of HT-6555-1 (purchased from Total Acrylic Polymer Industry (TAPI) Corporation), 1 g of cross-linking agent N (purchased from Total Acrylic Polymer Industry (TAPI) Corporation), 4 g of U-4HA (purchased from Shin-Nakamura Chemical Co., Ltd.), 4 g of U-4H (purchased from Shin-Nakamura Chemical Co., Ltd.), and 0.5 g of 1,1,3,3-tetramethylbutyl hydroperoxide (purchased from ECHO Chemical Co., Ltd.) are introduced into a 250 ml container and stirred for 10 minutes. The mixture is coated on the other side of the polyimide substrate already coated with the heat-resisting adhesive with a scraper capable of gap control to thereby ensure that the coating adhesive is 5 µm thick. Then, the polyimide substrate is placed in an oven to undergo solvent removal by being baked at 100° C. for 30 minutes. After that, a sample is taken out of the oven, and the sample is covered with a release film, thereby forming the heat-resisting thermally-visbreaking pressure-sensing adhesive layer on the second surface of the composite film. An adhesiveness strength testing method intended for result evaluation shows that the first surface has an adhesiveness strength of 267 gf/inch before the heating process and an adhesiveness strength of 412 gf/inch after the heating process, and shows that the second surface has an adhesiveness strength of 215 gf/inch before the heating process and an adhesiveness strength of 143 gf/inch after the heating process.

Embodiment 3

A heat-resisting acrylic adhesive agent, such as 50 g of HT-6555-1 (purchased from Total Acrylic Polymer Industry (TAPI) Corporation), and 1.7 g of cross-linking agent N (purchased from Total Acrylic Polymer Industry (TAPI) Corporation) are introduced into a 250 ml container and stirred for 10 minutes. The mixture is coated on a polyimide substrate (model number: TL-025, purchased from Taimide Technology Incorporation) with a scraper capable of gap control to thereby ensure that the coating adhesive is 28 µm thick. Then, the polyimide substrate is placed in an oven to undergo solvent removal by being baked at 100° C. for 30 minutes. After that, a sample is taken out of the oven, and the sample is covered with a release film. Next, the sample undergoes a ripening process at 50° C. for 24 hours to form the heat-resisting pressure-sensing adhesive layer on the first surface of the composite film. A heat-resisting acrylic adhesive agent, such as 50 g of HT-6555-1 (purchased from Total Acrylic Polymer Industry (TAPI) Corporation), 0.5 g of cross-linking agent N (purchased from Total Acrylic Polymer Industry (TAPI) Corporation), 3 g of U-4HA (purchased from Shin-Nakamura Chemical Co., Ltd.), 5 g of U-4H (purchased from Shin-Nakamura Chemical Co., Ltd.), and 0.5 g of 1,1,3,3-tetramethylbutyl hydroperoxide (purchased from ECHO Chemical Co., Ltd.) are introduced into a 250 ml container and stirred for 10 minutes. The mixture is coated on the other side of the polyimide substrate already coated with the heat-resisting adhesive with a scraper capable of gap control to thereby ensure that the coating adhesive is 40 μm thick. Then, the polyimide substrate is placed in an oven to undergo solvent removal by being baked at 100° C. for 30 minutes. After that, a sample is taken out of the oven, and the sample is covered with a release film, thereby forming the heat-resisting thermally-visbreaking pressure-sensing adhesive layer on the second surface of the composite film. An adhesiveness strength testing method intended for result evaluation shows that the first surface has an adhesiveness strength of 345 gf/inch before the heating process and an adhesiveness strength of 545 gf/inch after the heating process, and shows that the second surface has an adhesiveness strength of 1082 gf/inch before the heating process and an adhesiveness strength of 132 gf/inch after the heating process.

Embodiment 4

A heat-resisting acrylic adhesive agent, such as 50 g of HT-6555-1 (purchased from Total Acrylic Polymer Industry (TAPI) Corporation), and 0.3 g of cross-linking agent N (purchased from Total Acrylic Polymer Industry (TAPI) Corporation) are introduced into a 250 ml container and stirred for 10 minutes. The mixture is coated on a polyimide substrate (model number: TL-025, purchased from Taimide Technology Incorporation) with a scraper capable of gap control to thereby ensure that the coating adhesive is 28 μm thick. Then, the polyimide substrate is placed in an oven to undergo solvent removal by being baked at 100° C. for 30 minutes. After that, a sample is taken out of the oven, and the sample is covered with a release film. Next, the sample undergoes a ripening process at 50° C. for 24 hours to form the heat-resisting pressure-sensing adhesive layer on the first surface of the composite film. A heat-resisting acrylic adhesive agent, such as 50 g of HT-6555-1 (purchased from Total Acrylic Polymer Industry (TAPI) Corporation), 0.5 g of cross-linking agent N (purchased from Total Acrylic Polymer Industry (TAPI) Corporation), 3 g of U-4HA (purchased from Shin-Nakamura Chemical Co., Ltd.), 5 g of U-4H (purchased from Shin-Nakamura Chemical Co., Ltd.), and 0.5 g of 1,1,3,3-tetramethylbutyl hydroperoxide (purchased from ECHO Chemical Co., Ltd.) are introduced into a 250 ml container and stirred for 10 minutes. The mixture is coated on the other side of the polyimide substrate already coated with the heat-resisting adhesive with a scraper capable of gap control to thereby ensure that the coating adhesive is 40 μm thick. Then, the polyimide substrate is placed in an oven to undergo solvent removal by being baked at 100° C. for 30 minutes. After that, a sample is taken out of the oven, and the sample is covered with a release film, thereby forming the heat-resisting thermally-visbreaking pressure-sensing adhesive layer on the second surface of the composite film. An adhesiveness strength testing method intended for result evaluation shows that the first surface has an adhesiveness strength of 1450 gf/inch before the heating process and an adhesiveness strength of 1905 gf/inch after the heating process, and shows that the second surface has an adhesiveness strength of 1082 gf/inch before the heating process and an adhesiveness strength of 132 gf/inch after the heating process.

Comparison 1

A heat-resisting acrylic adhesive agent, such as 50 g of HT-6555-1 (purchased from Total Acrylic Polymer Industry (TAPI) Corporation), and 1.8 g of cross-linking agent N (purchased from Total Acrylic Polymer Industry (TAPI) Corporation) are introduced into a 250 ml container and stirred for 10 minutes. The mixture is coated on a polyimide substrate (model number: TL-025, purchased from Taimide Technology Incorporation) with a scraper capable of gap control to thereby ensure that the coating adhesive is 10 μm thick. Then, the polyimide substrate is placed in an oven to undergo solvent removal by being baked at 100° C. for 30 minutes. After that, a sample is taken out of the oven, and the sample is covered with a release film. Next, the sample undergoes a ripening process at 50° C. for 24 hours to form the heat-resisting pressure-sensing adhesive layer on the first surface of the composite film. A heat-resisting acrylic adhesive agent, such as 50 g of HT-6555-1 (purchased from Total Acrylic Polymer Industry (TAPI) Corporation), 0.5 g of cross-linking agent N (purchased from Total Acrylic Polymer Industry (TAPI) Corporation), 3 g of U-4HA (purchased from Shin-Nakamura Chemical Co., Ltd.), 5 g of U-4H (purchased from Shin-Nakamura Chemical Co., Ltd.), and 0.5 g of 1,1,3,3-tetramethylbutyl hydroperoxide (purchased from ECHO Chemical Co., Ltd.) are introduced into a 250 ml container and stirred for 10 minutes. The mixture is coated on the other side of the polyimide substrate already coated with the heat-resisting adhesive with a scraper capable of gap control to thereby ensure that the coating adhesive is 40 μm thick. Then, the polyimide substrate is placed in an oven to undergo solvent removal by being baked at 100° C. for 30 minutes. After that, a sample is taken out of the oven, and the sample is covered with a release film, thereby forming the heat-resisting thermally-visbreaking pressure-sensing adhesive layer on the second surface of the composite film. An adhesiveness strength testing method intended for result evaluation shows that the first surface has an adhesiveness strength of 239 gf/inch before the heating process and an adhesiveness strength of 419 gf/inch after the heating process, and shows that the second surface has an adhesiveness strength of 1082 gf/inch before the heating process and an adhesiveness strength of 132 gf/inch after the heating process.

Comparison 2

A heat-resisting acrylic adhesive agent, such as 50 g of HT-6555-1 (purchased from Total Acrylic Polymer Industry (TAPI) Corporation), and 1.7 g of cross-linking agent N (purchased from Total Acrylic Polymer Industry (TAPI) Corporation) are introduced into a 250 ml container and stirred for 10 minutes. The mixture is coated on a polyimide substrate (model number: TL-025, purchased from Taimide Technology Incorporation) with a scraper capable of gap control to thereby ensure that the coating adhesive is 33 μm thick. Then, the polyimide substrate is placed in an oven to undergo solvent removal by being baked at 100° C. for 30 minutes. After that, a sample is taken out of the oven, and the sample is covered with a release film. Next, the sample undergoes a ripening process at 50° C. for 24 hours to form the heat-resisting pressure-sensing adhesive layer on the first surface of the composite film. A heat-resisting acrylic adhesive agent, such as 50 g of HT-6555-1 (purchased from Total Acrylic Polymer Industry (TAPI) Corporation), 0.5 g of cross-linking agent N (purchased from Total Acrylic Polymer Industry (TAPI) Corporation), 3 g of U-4HA (purchased from Shin-Nakamura Chemical Co., Ltd.), 5 g of U-4H (purchased from Shin-Nakamura Chemical Co., Ltd.), and 0.5 g of 1,1,3,3-tetramethylbutyl hydroperoxide (purchased from ECHO Chemical Co., Ltd.) are introduced into a 250 ml container and stirred for 10 minutes. The mixture is coated on the other side of the polyimide substrate already coated with the heat-resisting adhesive with a scraper capable of gap control to thereby ensure that the coating adhesive is 40 µm thick. Then, the polyimide substrate is placed in an oven to undergo solvent removal by being baked at 100° C. for 30 minutes. After that, a sample is taken out of the oven, and the sample is covered with a release film, thereby forming the heat-resisting thermally-visbreaking pressure-sensing adhesive layer on the second surface of the composite film. An adhesiveness strength testing method intended for result evaluation shows that the first surface has an adhesiveness strength of 380 gf/inch before the heating process and an adhesiveness strength of 598 gf/inch after the heating process, and shows that the second surface has an adhesiveness strength of 1082 gf/inch before the heating process and an adhesiveness strength of 132 gf/inch after the heating process.

Comparison 3

A heat-resisting acrylic adhesive agent, such as 40 g of HT-6555-1, 10 g of RS-312 (purchased from Total Acrylic Polymer Industry (TAPI) Corporation), and 1.5 g of cross-linking agent N (purchased from Total Acrylic Polymer Industry (TAPI) Corporation) are introduced into a 250 ml container and stirred for 10 minutes. The mixture is coated on a polyimide substrate (model number: TL-025, purchased from Taimide Technology Incorporation) with a scraper capable of gap control to thereby ensure that the coating adhesive is 10 µm thick. Then, the polyimide substrate is placed in an oven to undergo solvent removal by being baked at 100° C. for 30 minutes. After that, a sample is taken out of the oven, and the sample is covered with a release film. Next, the sample undergoes a ripening process at 50° C. for 24 hours, thereby forming the heat-resisting pressure-sensing adhesive layer on the first surface of the composite film. A heat-resisting acrylic adhesive agent, such as 50 g of HT-6555-1 (purchased from Total Acrylic Polymer Industry (TAPI) Corporation), 0.5 g of cross-linking agent N (purchased from Total Acrylic Polymer Industry (TAPI) Corporation), 3 g of U-4HA (purchased from Shin-Nakamura Chemical Co., Ltd.), 5 g of U-4H (purchased from Shin-Nakamura Chemical Co., Ltd.), and 0.5 g of 1,1,3,3-tetramethylbutyl hydroperoxide (purchased from ECHO Chemical Co., Ltd.) are introduced into a 250 ml container and stirred for 10 minutes. The mixture is coated on the other side of the polyimide substrate already coated with the heat-resisting adhesive with a scraper capable of gap control to thereby ensure that the coating adhesive is 40 µm thick. Then, the polyimide substrate is placed in an oven to undergo solvent removal by being baked at 100° C. for 30 minutes. After that, a sample is taken out of the oven, and the sample is covered with a release film, thereby forming the heat-resisting thermally-visbreaking pressure-sensing adhesive layer on the second surface of the composite film. An adhesiveness strength testing method intended for result evaluation shows that the first surface has an adhesiveness strength of 270 gf/inch before the heating process and an adhesiveness strength of 388 gf/inch after the heating process, and shows that the second surface has an adhesiveness strength of 1082 gf/inch before the heating process and an adhesiveness strength of 132 gf/inch after the heating process.

Comparison 4

A heat-resisting acrylic adhesive agent, such as 50 g of HT-6555-1 (purchased from Total Acrylic Polymer Industry (TAPI) Corporation), and 1.5 g of cross-linking agent N (purchased from Total Acrylic Polymer Industry (TAPI) Corporation) are introduced into a 250 ml container and stirred for 10 minutes. The mixture is coated on a polyimide substrate (model number: TL-025, purchased from Taimide Technology Incorporation) with a scraper capable of gap control to thereby ensure that the coating adhesive is 10 µm thick. Then, the polyimide substrate is placed in an oven to undergo solvent removal by being baked at 100° C. for 30 minutes. After that, a sample is taken out of the oven, and the sample is covered with a release film. Next, the sample undergoes a ripening process at 50° C. for 24 hours to form the heat-resisting pressure-sensing adhesive layer on the first surface of the composite film. A heat-resisting acrylic adhesive agent, such as 50 g of HT-6555-1 (purchased from Total Acrylic Polymer Industry (TAPI) Corporation), 1.2 g of cross-linking agent N (purchased from Total Acrylic Polymer Industry (TAPI) Corporation), 4 g of U-4HA (purchased from Shin-Nakamura Chemical Co., Ltd.), 4 g of U-4H (purchased from Shin-Nakamura Chemical Co., Ltd.), and 0.5 g of 1,1,3,3-tetramethylbutyl hydroperoxide (purchased from ECHO Chemical Co., Ltd.) are introduced into a 250 ml container and stirred for 10 minutes. The mixture is coated on the other side of the polyimide substrate already coated with the heat-resisting adhesive with a scraper capable of gap control to thereby ensure that the coating adhesive is 5 µm thick. Then, the polyimide substrate is placed in an oven to undergo solvent removal by being baked at 100° C. for 30 minutes. After that, a sample is taken out of the oven, and the sample is covered with a release film, thereby forming the heat-resisting thermally-visbreaking pressure-sensing adhesive layer on the second surface of the composite film. An adhesiveness strength testing method intended for result evaluation shows that the first surface has an adhesiveness strength of 267 gf/inch before the heating process and an adhesiveness strength of 412 gf/inch after the heating process, and shows that the second surface has an adhesiveness strength of 190 gf/inch before the heating process and an adhesiveness strength of 145 gf/inch after the heating process.

Comparison 5

A heat-resisting acrylic adhesive agent, such as 50 g of HT-6555-1 (purchased from Total Acrylic Polymer Industry (TAPI) Corporation), and 1.5 g of cross-linking agent N (purchased from Total Acrylic Polymer Industry (TAPI) Corporation) are introduced into a 250 ml container and stirred for 10 minutes. The mixture is coated on a polyimide substrate (model number: TL-025, purchased from Taimide Technology Incorporation) with a scraper capable of gap control to thereby ensure that the coating adhesive is 10 µm thick. Then, the polyimide substrate is placed in an oven to undergo solvent removal by being baked at 100° C. for 30 minutes. After that, a sample is taken out of the oven, and the sample is covered with a release film. Next, the sample undergoes a ripening process at 50° C. for 24 hours to form the heat-resisting pressure-sensing adhesive layer on the first surface of the composite film. A heat-resisting acrylic adhesive agent, such as 50 g of HT-6555-1 (purchased from Total Acrylic Polymer Industry (TAPI) Corporation), and 0.45 g of cross-linking agent N (purchased from Total Acrylic Polymer Industry (TAPI) Corporation), 2.5 g of U-4HA (purchased from Shin-Nakamura Chemical Co., Ltd.), 4.8 g of U-4H (purchased from Shin-Nakamura Chemical Co., Ltd.), and 0.5 g of 1,1,3,3-tetramethylbutyl hydroperoxide (purchased from ECHO Chemical Co., Ltd.) are introduced into a 250 ml container and stirred for 10 minutes. The mixture is coated on the other side of the polyimide substrate already coated with the heat-resisting adhesive with a scraper capable of gap control to thereby ensure that the coating adhesive is 40 μm thick. Then, the polyimide substrate is placed in an oven to undergo solvent removal by being baked at 100° C. for 30 minutes. After that, a sample is taken out of the oven, and the sample is covered with a release film, thereby forming the heat-resisting thermally-visbreaking pressure-sensing adhesive layer on the second surface of the composite film. An adhesiveness strength testing method intended for result evaluation shows that the first surface has an adhesiveness strength of 267 gf/inch before the heating process and an adhesiveness strength of 412 gf/inch after the heating process, and shows that the second surface has an adhesiveness strength of 1134 gf/inch before the heating process and an adhesiveness strength of 173 gf/inch after the heating process.

Tabular Presentation of Embodiments and Comparisons

| | | Composite film | | | | | | | | |
|---|---|---|---|---|---|---|---|---|---|---|
| | | First surface (heat-resisting pressure-sensing adhesive layer) | | | Second surface (heat-resisting thermally-visbreaking pressure-sensing adhesive layer) | | | | | |
| | | Adhesiveness strength (gf/inch) | | | Adhesiveness strength (gf/inch) | | | | | |
| Case | Thickness (μm) | Before heating process | After heating process | Thickness (μm) | Before heating process | After heating process | Die bonding process | Packaging process | Wafer dicing | Substrate removal process |
| Embodiment 1 | 10 | 267 | 412 | 40 | 1082 | 132 | Very good | Without problem | Without problem | Very good |
| Embodiment 2 | 10 | 267 | 412 | 5 | 215 | 143 | Very good | Without problem | Without problem | Very good |
| Embodiment 3 | 28 | 345 | 545 | 40 | 1082 | 132 | Very good | Without problem | Without problem | Very good |
| Embodiment 4 | 28 | 1450 | 1905 | 40 | 1082 | 132 | Very good | Without problem | Without problem | Very good |
| Comparison 1 | 10 | 239 | 419 | 40 | 1082 | 132 | Dice detach easily | Without problem | — | — |
| Comparison 2 | 33 | 380 | 598 | 40 | 1082 | 132 | Very good | Without problem | Dice adhere to each other | — |
| Comparison 3 | 10 | 270 | 388 | 40 | 1082 | 132 | Very good | Without problem | Dice detach easily | — |
| Comparison 4 | 10 | 267 | 412 | 5 | 190 | 145 | Very good | Dice dislocate easily | — | — |
| Comparison 5 | 10 | 267 | 412 | 40 | 1134 | 173 | Very good | Without problem | Without problem | Difficult to remove |

Although the present disclosure is disclosed above by specific embodiments, the embodiments are not restrictive of the present disclosure. Changes and modifications made by persons skilled in the art to the embodiments without departing from the scope of the appended claims must be deemed falling within the scope of the present disclosure.

While the present disclosure has been described by means of specific embodiments, numerous modifications and variations could be made thereto by those skilled in the art without departing from the scope and spirit of the present disclosure set forth in the claims.

What is claimed is:

1. A composite film comprising:
   a substrate comprising a first surface and a second surface;
   a first heat-resisting pressure-sensing adhesive being of a thickness less than 30 μm, formed on the first surface of the substrate, wherein the first heat-resisting pressure-sensing adhesive has an adhesiveness strength greater than 250 gf/inch before heating to 150~180° C. and an adhesiveness strength greater than 400 gf/inch after heating to 150~180° C.; and
   a second heat-resisting pressure-sensing adhesive formed on the second surface of the substrate, wherein the second heat-resisting pressure-sensing adhesive has an adhesiveness strength greater than 200 gf/inch before heating to 150~180° C. and an adhesiveness strength less than 150 gf/inch after heating to 150~180° C.

2. The composite film of claim 1, wherein the substrate is a polyimide film.

3. The composite film of claim 1, wherein the first heat-resisting pressure-sensing adhesive is an acrylic-based pressure-sensing adhesive agent, a rubber pressure-sensing adhesive agent, an allyl pressure-sensing adhesive patch, a vinyl-alkyl ether pressure-sensing adhesive patch, a silicone pressure-sensing adhesive patch, a polyester pressure-sensing adhesive patch, a polyamide pressure-sensing adhesive patch, an ethyl carbamate pressure-sensing adhesive patch, a polystyrene/diene copolymer pressure-sensing adhesive patch, an allyl pressure-sensing adhesive agent, an ethyl carbamate pressure-sensing adhesive agent, or a polystyrene/diene copolymer.

* * * * *